US011317527B2

(12) United States Patent
Huang et al.

(10) Patent No.: US 11,317,527 B2
(45) Date of Patent: Apr. 26, 2022

(54) SUPPORTING DEVICE

(71) Applicant: SYNCMOLD ENTERPRISE CORP., New Taipei (TW)

(72) Inventors: Chun-Hao Huang, New Taipei (TW); Chien-Cheng Yeh, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 0 days.

(21) Appl. No.: 17/190,903

(22) Filed: Mar. 3, 2021

(65) Prior Publication Data
US 2021/0315114 A1 Oct. 7, 2021

Related U.S. Application Data

(60) Provisional application No. 63/003,545, filed on Apr. 1, 2020.

(30) Foreign Application Priority Data

Dec. 14, 2020 (TW) .................................. 109216480

(51) Int. Cl.
*H05K 5/02* (2006.01)
*F16M 11/10* (2006.01)
(52) U.S. Cl.
CPC .......... *H05K 5/0234* (2013.01); *F16M 11/10* (2013.01); *F16M 2200/041* (2013.01); *F16M 2200/066* (2013.01)
(58) Field of Classification Search
CPC ................ H05K 5/0234; F16M 11/10; F16M 2200/041; F16M 2200/066

USPC ................ 248/584, 917, 919, 920, 921, 922
See application file for complete search history.

(56) References Cited

U.S. PATENT DOCUMENTS

| | | | |
|---|---|---|---|
| 6,769,657 B1* | 8/2004 | Huang | F16M 11/10 248/278.1 |
| 7,188,812 B2* | 3/2007 | Wang | F16M 11/2064 248/276.1 |
| 7,336,479 B2* | 2/2008 | Liu | F16M 11/10 248/921 |
| 7,513,474 B2* | 4/2009 | Anderson | F16M 11/10 248/284.1 |
| 7,726,616 B2* | 6/2010 | Zhang | F16M 11/2092 248/284.1 |
| 8,011,632 B2* | 9/2011 | Wang | F16M 11/10 248/284.1 |
| 8,061,663 B2* | 11/2011 | Wang | F16M 11/2021 248/162.1 |
| 8,794,579 B2* | 8/2014 | Sturman | F16M 11/2092 248/284.1 |

(Continued)

FOREIGN PATENT DOCUMENTS

TW M478966 U 5/2014

*Primary Examiner* — Muhammad Ijaz
(74) *Attorney, Agent, or Firm* — Muncy, Geissler, Olds & Lowe, P.C.

(57) ABSTRACT

A supporting device for bearing a display is provided. The supporting device comprises a base, a hollow housing, a bearing module, a linkage module, and an elastic element, wherein an elastic force provided by the elastic element is the greatest when the hollow housing is in a horizontal position; the elastic force decreases when the hollow housing moves from the horizontal position to a raised position, hence, the hollow housing can stop at any positons between the horizontal position and the raised position.

18 Claims, 12 Drawing Sheets

(56) References Cited

U.S. PATENT DOCUMENTS

2007/0040084 A1* 2/2007 Sturman .............. F16M 11/041
                                                      248/280.11
2007/0041150 A1* 2/2007 Short .................... F16M 11/10
                                                      361/679.22

* cited by examiner

SUPPORTING DEVICE

CROSS REFERENCE TO RELATED APPLICATION

This application claims benefit of U.S. Provisional Application Ser. No. 63/003,545, filed on Apr. 1, 2020, and the benefit of Taiwan Patent Application Serial No. 109216480 filed on Dec. 14, 2020. The entirety of the Application is incorporated herein by reference.

BACKGROUND OF THE INVENTION

1. Field of the Invention

The present invention relates to a supporting device, particularly a supporting device used for bearing a display.

2. Description of Related Art

A supporting device for supporting a display is disclosed in Taiwan Patent No. M478966, wherein the supporting device is utilized for bearing and adjusting the height and the tilt angle of the display. The supporting device includes a base, a first rod, a second rod, and a third rod, wherein the base, the first rod, the second rod, and the third rod form a four-bar linkage. When the height of the display mounted on the supporting device is adjusted, the tilt angle of the display remains unchanged (that is, the included angle between the normal of the display and the gravity direction remains unchanged). However, the first rod and the second rod will move up and down during the process of the adjustment; therefore, larger working space is required. Additionally, the restriction of the shape of the four-bar linkage makes reducing the size of the supporting device more difficult.

A supporting device includes a five-bar linkage is disclosed in the present invention, wherein the tilt angle of the display mounted on the supporting device remains unchanged while adjusting the height of the display via the five-bar linkage. Also, the supporting device of the present invention is not limited in shape, the size of the supporting device can be significantly decreased.

SUMMARY OF THE INVENTION

A supporting device is disclosed for bearing a display, wherein the supporting device comprises a base including a first shaft; a hollow housing including a first pivoting end, a second pivoting end, and a sliding slot, wherein the sliding slot is formed between the first pivoting end and the second pivoting end, the first pivoting end is pivoted to the first shaft, wherein the hollow housing is changed between a horizontal position and an raised position; a bearing module being connected to the display and including a second shaft, wherein the hollow housing is connected to the second shaft, a central axis is defined by linking a center of the first shaft and a center of the second shaft; a linkage module being accommodating in the hollow housing and including a first connecting rod being fixed to the first shaft and being static with respect to the base; a second connecting rod being pivotally disposed with respect to the first connecting rod through a first pivot; a third connecting rod being slidably disposed in the sliding slot and pivotally disposed with respect to the second connecting rod through a second pivot; a fourth connecting rod being pivotally disposed with respect to the third connecting rod through a third pivot; and a fifth connecting rod being pivotally disposed with respect to the fourth connecting rod through a fourth pivot with one end thereof and disposed on the second shaft with the other end thereof; and an elastic element being disposed in the hollow housing, abutting the third connecting rod and the second pivoting end, and providing an elastic force. The elastic force is the greatest when the hollow housing is in the horizontal position; the elastic force decreases when the hollow housing is moved from the horizontal position to the raised position and the third connecting rod slides in the sliding slot so that the hollow housing stops at any position between the horizontal position and the raised position.

In one embodiment, a virtual surface extending along a radial direction of the first shaft and a radial direction of the second shaft and passing through the central axis is defined, wherein the first pivot, the second pivot, and the fourth pivot are constantly located at a same side of the virtual surface while the third pivot is constantly located at the other side of the virtual surface, wherein the first pivot, the second pivot, and the fourth pivot are constantly located at a same side of the virtual surface while the third pivot is constantly located at the other side of the virtual surface.

In one embodiment, the second pivoting end of the hollow housing is activated by the bearing module to rotate in a first rotating direction around the first pivoting end when the linkage module is moved from the horizontal position to the raised position, hence the second connecting rod is pulled by the first connecting rod and the third connecting rod is pulled by the second connecting rod, the third connecting rod slides in the sliding slot hence the elastic force of the elastic element decreases, the fourth connecting rod is activated by the third connecting rod simultaneously while the fourth pivot to rotate around the second shaft thus an angle between the bearing module and a gravity direction remains the same.

In one embodiment, the second connecting rod is a straight connecting rod and the fourth connecting rod is a curved connecting rod.

In one embodiment, an orthogonal projection of an axis center of the fourth pivot projected on the central axis locates between the center of the second shaft and the orthogonal projection of an axis center of the third pivot projected on the central axis, and the center of the first shaft locates between an orthogonal projection of an axis center of the first pivot projected on the central axis and an orthogonal projection of an axis center of the second pivot projected on the central axis when the linkage module is in the raised position.

In one embodiment, the center of the second shaft is adjacent to the orthogonal projection of the axis center of the fourth pivot projected on the central axis when the linkage module is in the horizontal position.

In one embodiment, the hollow housing further comprises a first stopper, a second stopper, and a first stopping unit, wherein the first stopper and the second stopper are adjacent to the first pivoting end and the first stopping unit is adjacent to the second pivoting end; rotation of the hollow housing in the first rotating direction is restricted by the first stopper when the first stopper abuts against the first connecting rod; rotation of the hollow housing in a second rotating direction is restricted by the second stopper and the first stopping unit when the second stopper abuts against the first connecting rod and the first stopping unit abuts against the fifth connecting rod, wherein the second rotating direction is opposite to the first rotating direction.

In one embodiment, the first pivoting end further includes a first through-hole for setting the first shaft, a shape of a cross-section of the first through-hole is circular; therefore the hollow housing does not actuate the first shaft.

In one embodiment, the hollow housing further includes a mandrel, the mandrel is set through the first pivoting end and the second pivoting end, the third connecting rod further includes a concave portion and a hollow cylinder, wherein the hollow cylinder is formed in the concave portion, the elastic element is set on the mandrel with one end abutting against the concave portion and is set on the hollow cylinder, and the third connecting rod is slidably set on the mandrel via the hollow cylinder.

In one embodiment, a cross-section of the first shaft along its radial direction has two arc segments associated to each other and two straight segments between the arc segments, the base has a via hole, the first connecting rod has a fixing hole, wherein cross-sections of the via hole and the fixing hole are the same as the cross-section of the first shaft along its radial direction; wherein the first connecting rod is set on the first shaft through the fixing hole and is static with respect to the first shaft.

In one embodiment, the bearing module moves between an elevated position and a depressed angle and includes a connecting block and at least one washer set, wherein the washer set is set on the second shaft; the connecting block is set on the second shaft and is actuated by each other.

In one embodiment, a cross-section of the second shaft along its radial direction includes has two arc segments associated to each other and two straight segments between the arc segments, the connecting block has a mounting hole, wherein the cross-section of the mounting hole is the same as the cross-section of the second shaft along its radial direction; the fifth connecting rod had a penetrating hole and is set on the second shaft through the penetrating hole, wherein a shape of a cross-section of the penetrating hole is circular; therefore the second shaft does not actuate the fifth connecting rod In one embodiment, the bearing module further includes at least one torsional spring, each of the washer set includes a hook washer, two bowl washers, a first flat washer, and a second washer, wherein the hook washer is actuated with the second shaft, one end of the torsional spring is fixed to the hook washer and the other end of the torsional spring is fixed to the fifth connecting rod, and the bowl washers are clamped between the first flat washer and the second flat washer.

In one embodiment, each of the bowl washers, the first flat washer, and the second flat washer has a first hole with a circular cross-section, the bowl washers, the first flat washer, and the second flat washer are set on the second shaft through the first holes of the bowl washers, the first flat washer, and the second flat washer; therefore, the second shaft does not actuate the bowl washers, the first flat washer, and the second flat washer; the hook washer has a second hole and is set on the second shaft through the second hole, wherein a shape of a cross-section of the second hole is the same as the cross-section of the second shaft along its radial direction; therefore, the hook washer is actuated by the second shaft.

In one embodiment, the bearing module further has a screw; the fifth connecting rod has an accommodating space, and a pressing part, wherein the bowl washers, the first flat washer, the second flat washer, and the screw are accommodated in the accommodating space, wherein the bowl washers are clamped between the first flat washer and the second flat washer, the second flat washer contacts with the screw, and the first flat washer contacts with the pressing part, wherein a tightness between the first flat washer and the pressing part is adjusted by the screw.

In one embodiment, the fifth connecting rod is not actuated by the second shaft, and one end of the torsional spring rotates with the hook washer while the other end is fixed to the fifth connecting rod and remains static; therefore, the torsional force provided by the torsional spring is changed and a dynamic friction force is generated from the pressing part of the fifth connecting rod and the first flat washer when the bearing module moves between the elevated position and the depressed position.

In one embodiment, the fifth connecting rod has a limiting slot, a first limiting surface, and a second limiting surface, wherein the limiting slot interconnects with the penetrating hole and is formed between the first limiting surface and the second limiting surface, the second shaft has a limiting bump, wherein the limiting bump is accommodated in the limiting slot, abuts against the first limiting surface when the bearing module is in the raised position and abuts against the second limiting surface when the bearing module is in the depressed position.

In one embodiment, an included angle between the bearing module and a horizontal direction substantially is 30 degrees when the bearing module is in the raised position; the included angle between the bearing module and the horizontal direction substantially is 5 degrees when the bearing module is in the depressed position.

DETAILED DESCRIPTION OF THE PREFERRED EMBODIMENT

Figure 1:
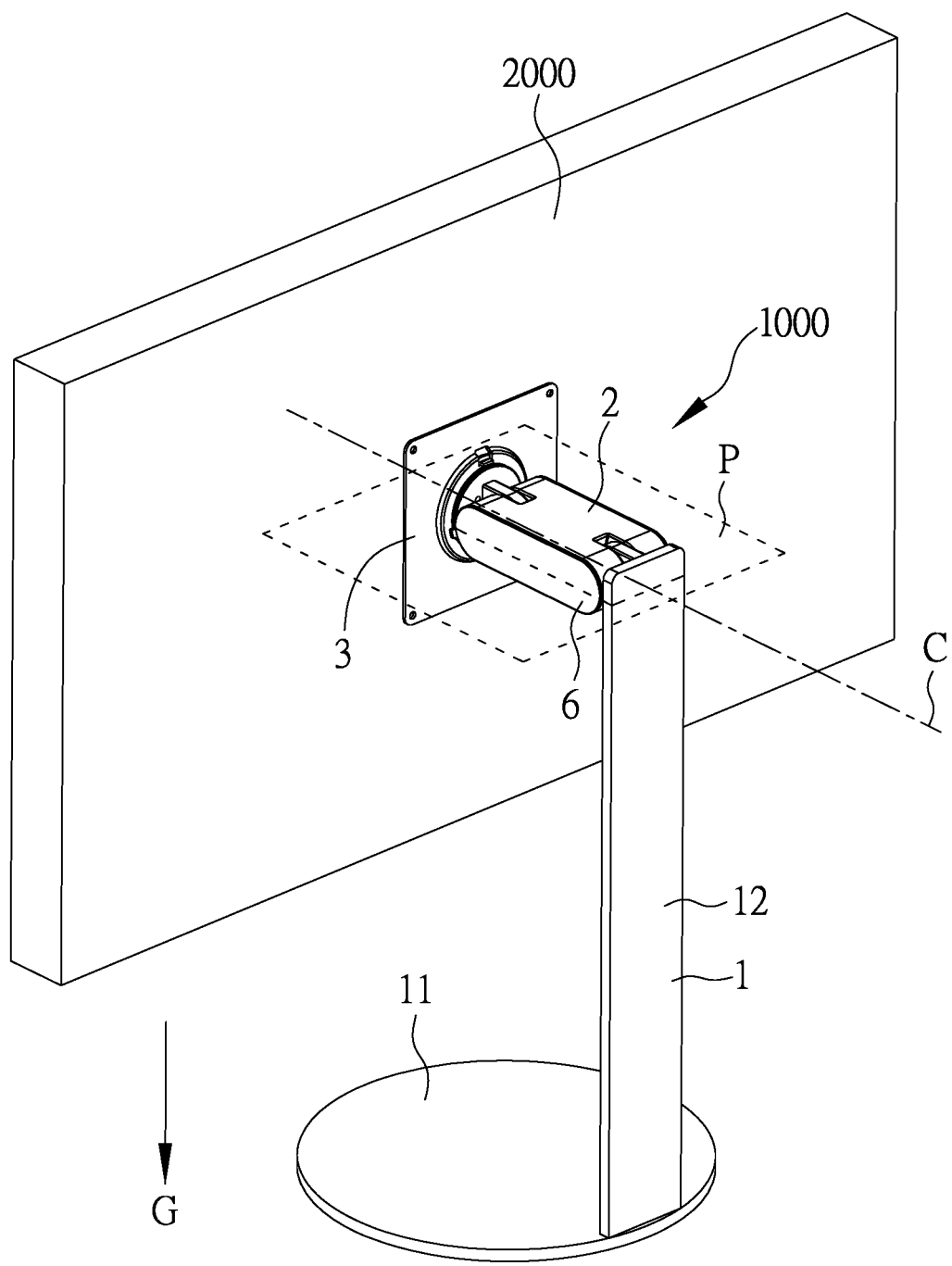
FIG. 1 is a perspective schematic view showing a supporting device of the present invention.
Figure 2:
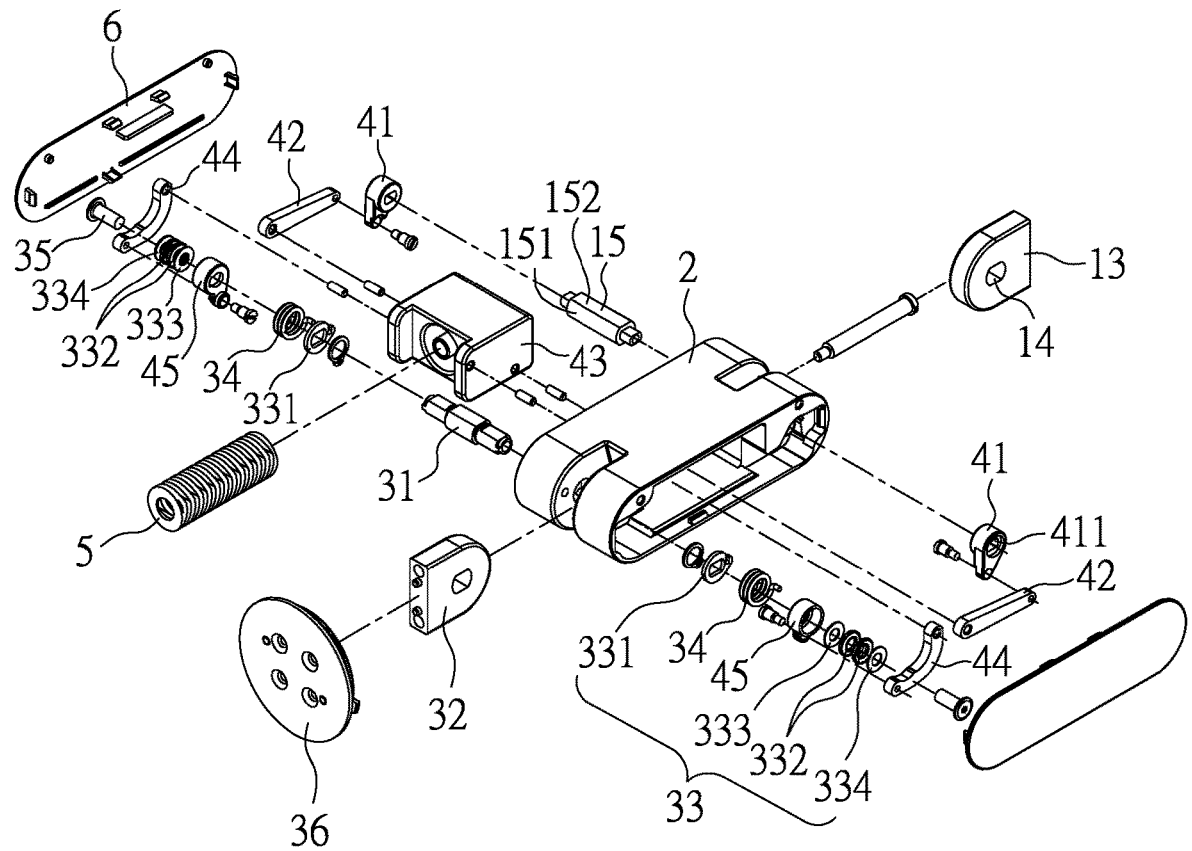
FIG. 2 is an exploded view showing a supporting device of the present invention.

Please refer to FIG. 1 and FIG. 2, which illustrate the perspective view and the exploded view of the supporting device 1000 of the present embodiment. The supporting device 1000 of the present embodiment is utilized for bearing a display 2000 and includes a base 1, a hollow housing 2, a bearing module 3, a linkage module 4, an elastic element 5, and two covers 6.

In detail, the base 1 is placed on a working surface (not shown in the figures) and includes a base plate 11, a post 12, an extending plate 13, a via hole 14, and a first shaft 15. The base plate 11 is placed on the working surface. One end of the post 12 is disposed on the base plate 11, while the extending plate 13 is disposed on the other end of the post 12. The via hole 14 is formed on the extending plate 13 and is penetrated through by the first shaft 15. The cross-section of the first shaft 15 along its radial direction has two arc segments 151 and two straight segments 152 formed between the arc segments 151. The shape of the cross-section of the via hole 14 is the same as the shape of the cross-section of the first shaft 15. Accordingly, the first shaft 15 is static with respect to the extending plate 13.

Figure 3:
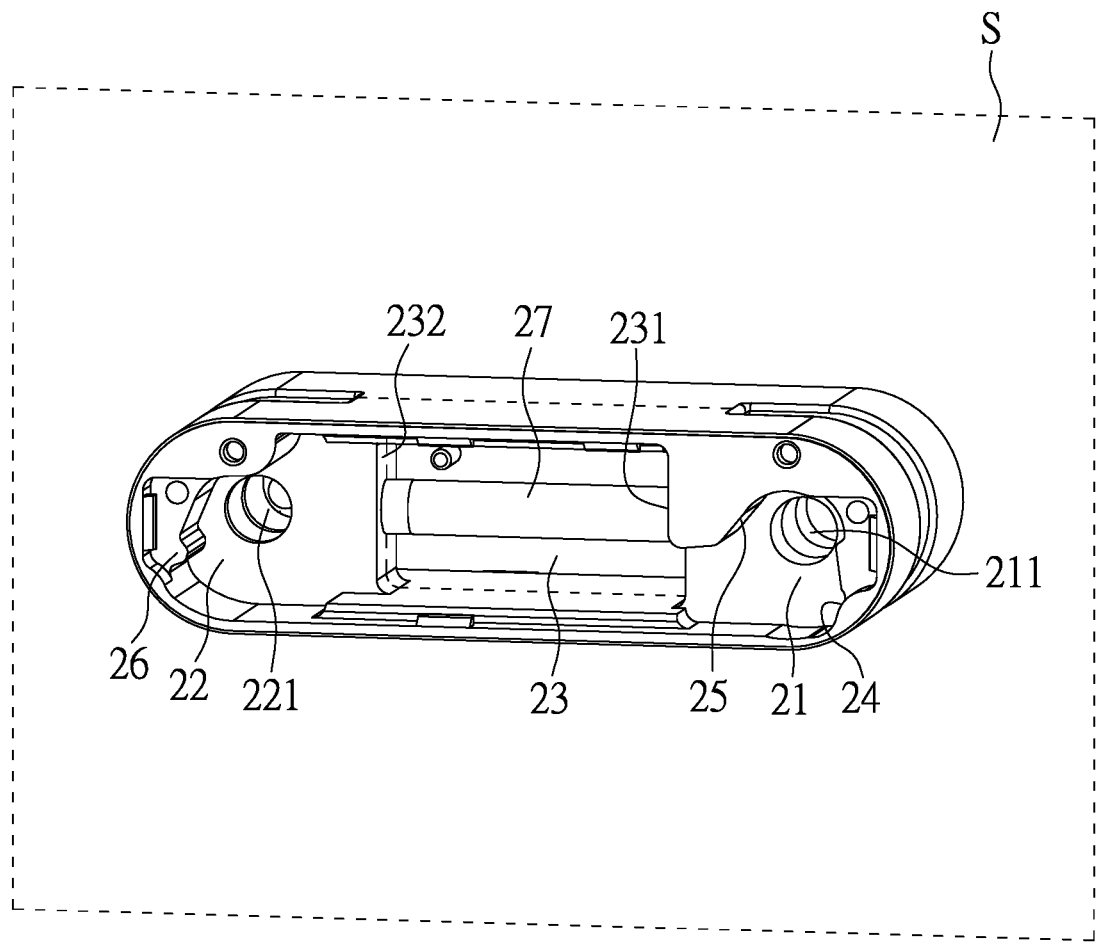
FIG. 3 is a perspective schematic view showing a hollow housing of the present invention.

Please refer to FIG. 3, the hollow housing 2 is a housing that is symmetrical based on a symmetry surface S, wherein the symmetry surface S passes through the center of the first shaft 15 and is perpendicular to the radial direction of the first shaft 15. The hollow housing 2 includes a first pivoting end 21, a second pivoting end 22, a sliding slot 23, two first stoppers 24, two second stoppers 25, two stopping unit 26, and a mandrel 27. The first pivoting end 21 has two first through-holes 211 and a first abutting surface 212, the first through-holes 211 are symmetrically formed at opposite sides of the symmetrical surface S and are penetrated through by the first shaft 15. The shape of the cross-section of each of the first through-holes 211 is circular; therefore, the hollow housing 2 is pivotally disposed on the first shaft 15 through the first pivoting end 21. The second pivoting end 22 is opposite to the first pivoting end 21 and has two second through-holes 221 and a second abutting surface 222. The shape of the cross-section of each of the second through-holes 221 is also circular, the second through-holes are symmetrically formed at opposite sides of the symmetrical surface S, and the second abutting surface 222 is opposite to the first abutting surface 212. The sliding slot 23 is located between the first pivoting end 21 and the second pivoting end 22. The first stoppers 24 are symmetrically formed at opposite sides of the symmetrical surface S and are adjacent to the first pivoting end 21; the second stoppers 25 are symmetrically formed at opposite sides of the symmetrical surface S and are adjacent to the first pivoting end 21. The first stopping unit 26 are symmetrically formed at opposite sides of the symmetrical surface S and are adjacent to the second pivoting end 22. The mandrel 27 substantially extends along the radial direction of the first shaft 15 and penetrates through the first pivoting end 21 and the second pivoting end 22.

Figure 4:
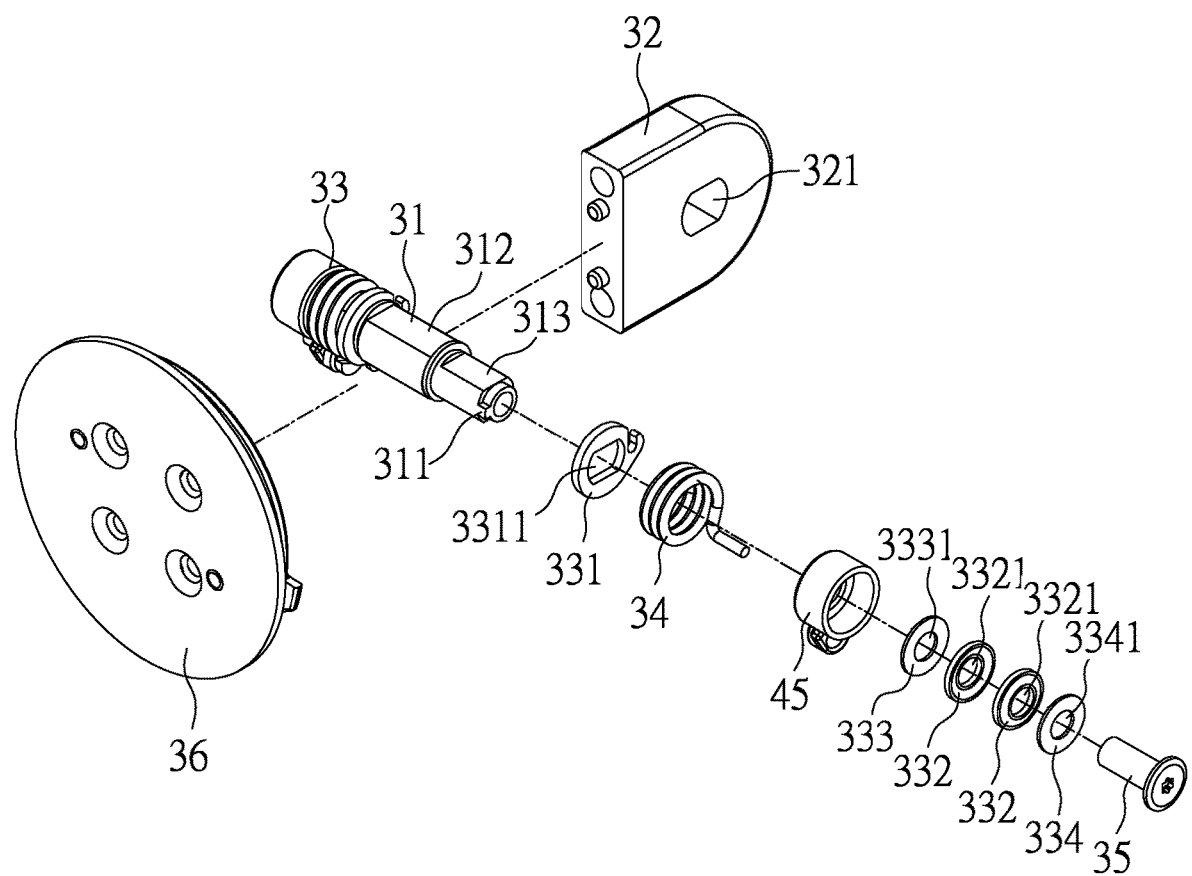
FIG. 4 is an exploded view showing a bearing module of the present invention.
Figure 5:
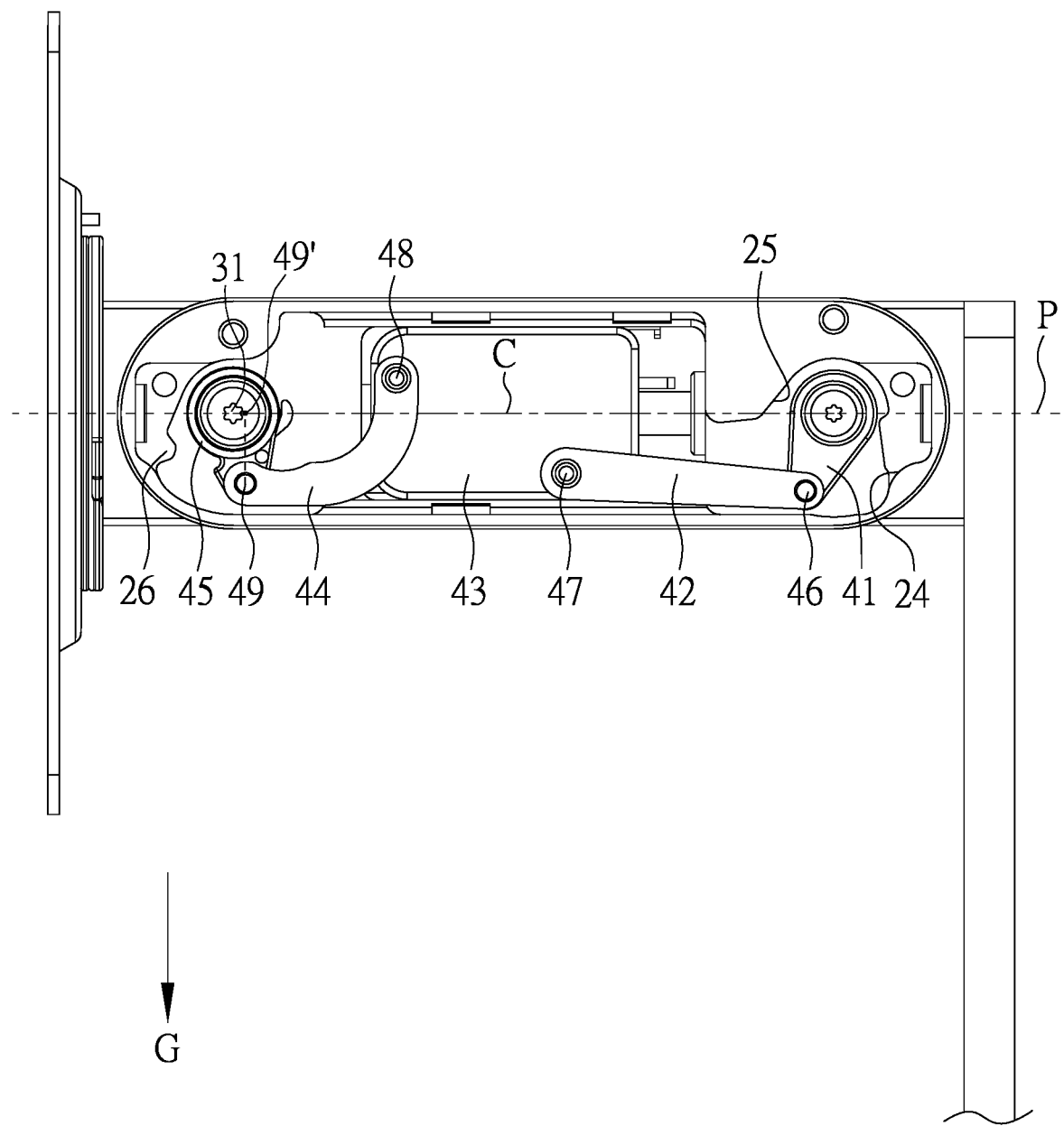
FIG. 5 is a side view showing a supporting device of the present invention.
Figure 11:
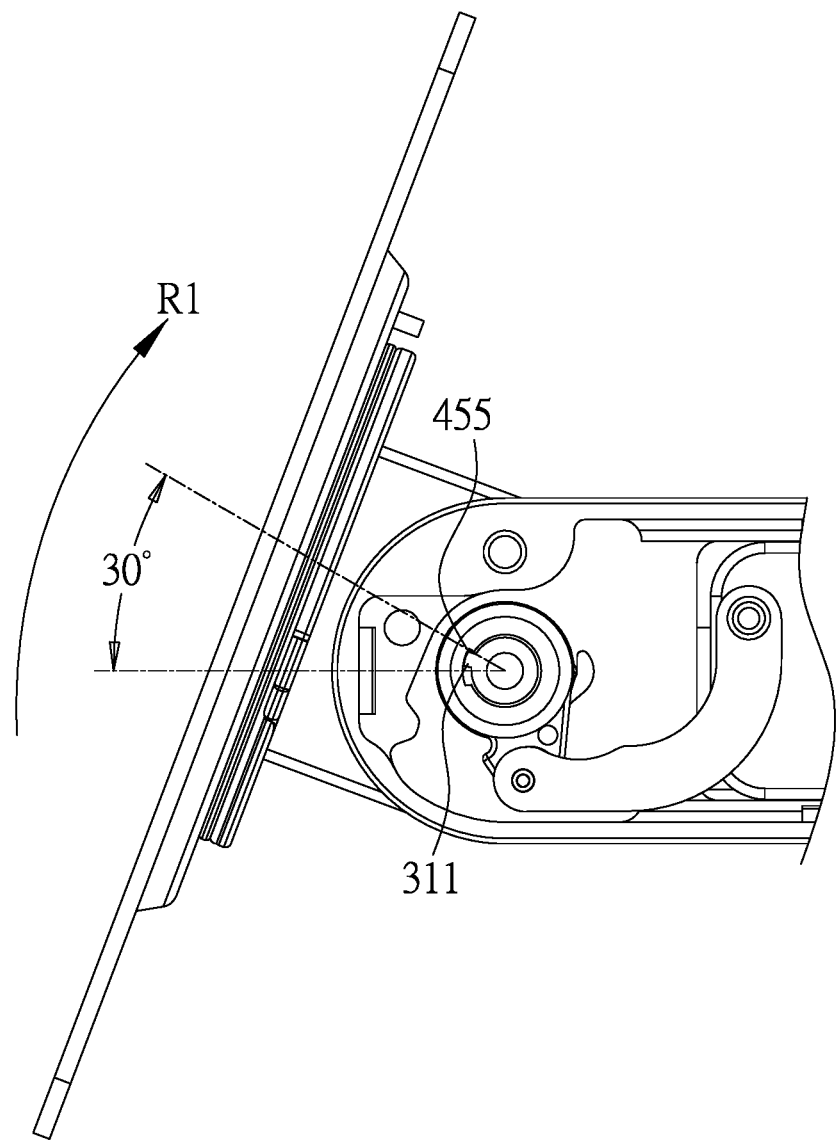
FIG. 11 is a side view showing a supporting device in an elevated position of the present invention.
Figure 12:
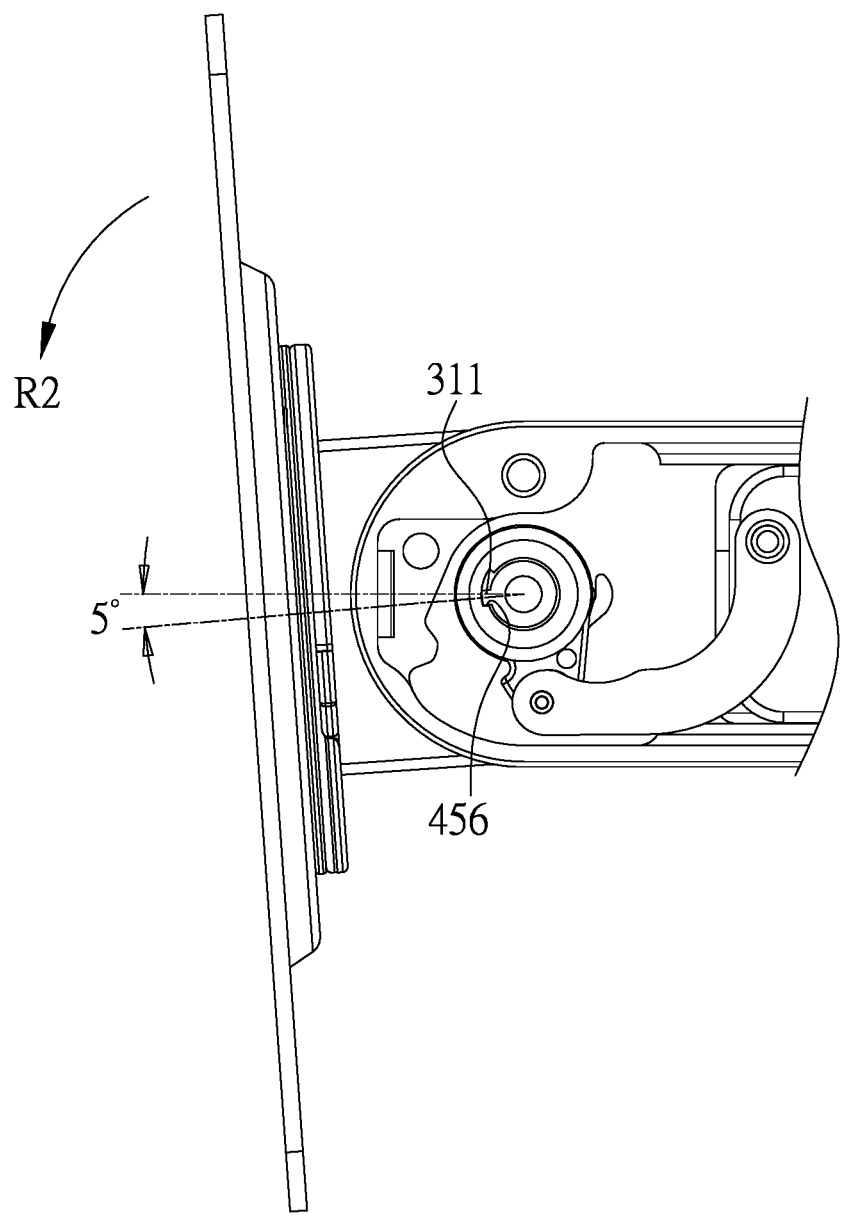
FIG. 12 is a side view showing a supporting device in a depressed position of the present invention.

Please refer to FIG. 4, the bearing module 3 is connected to the display 2000 and can move between an elevated position (as shown in FIG. 11) and a depressed position (as shown in FIG. 12). The bearing module 3 includes a second shaft 31, a connecting block 32, two washer sets 33, two torsional springs 34, two screws 35, and a connecting plate 36. The second shaft 31 penetrates through the second through-holes 221 of the second pivoting end 22; therefore, the bearing module 3 can pivotally rotate with respect to the second pivoting end 22. Refer to FIG. 5, a central axis C is defined by linking a center of the first shaft 15 and a center of the second shaft 31. The second shaft 31 has two limiting bumps 311, a large-diameter segment 312, and two small-diameter segments 313. The small-diameter segments 313 are separately connected to two ends of the large-diameter segment 312; while each of the limiting bumps 311 is correspondingly formed at an end of each of the small-diameter segments 313. The connecting block 32 has a mounting hole 321, wherein the shape of the cross-section of the mounting hole 321 is the same as that of the large-diameter segment 312 of the second shaft 31, and the large-diameter segment 312 penetrates through the mounting hole 321; therefore, the connecting block 32 is actuated by the second shaft 31. The washer sets 33 are respectively set on the small-diameter segments 313 of the second shaft 31 and are located at two sides of the connecting block 32.

As shown in FIG. 4, each of the washer sets 33 has a hook washer 331, two bowl washers 332, a first flat washer 333, and a second flat washer 334, wherein each of the bowl washers 332, the first flat washer 333, and the second flat washer 334 respectively has a first hole 3321, 3331, 3341 with a circular cross-section. The bowl washers 332, the first flat washer 333, and the second flat washer 334 are set on the small-diameter segment 313 of the second shaft 31 through the first holes 3321, 3331, 3341; therefore, the bowl washers 332, the first flat washer 333, and the second flat washer 334 are not actuated together with the second shaft 31. The hook washer 331 has a second hole 3311, wherein the shape of the cross-section of the second hole 3311 is the same as that of the cross-section of the small-diameter segment 313 along its radial direction. The hook washer 331 is set on the second shaft 31 through the second hole 3311 so that the hook washer 331 is actuated with the second shaft 31.

The torsional springs 34 are respectively set on the small-diameter segments 313 of the second shaft 31 with one end fixed to the hook washer 331 and the other end disposed on the linkage module 4. The screws 35 are screwed respectively to the small-diameter segments 313 of the second shaft 31. The connecting plate 36 is connected to the connecting block 32 for bearing the display 2000.

Please refer to FIG. 2 and FIG. 5, the linking module 4 is accommodated in the hollow housing 2 and includes two first connecting rods 41, two second connecting rods 42, a third connecting rod 43, two fourth connecting rods 44, two fifth connecting rods 45, two first pivots 46, two second pivots 47, two third pivots 48, and two fourth pivots 49. In FIG. 5, visible components on the same side are illustrated. In the present embodiment, one of the first connecting rods 41, one of the second connecting rods 42, one of the fourth rods 44, one of the fifth rods 45, one of the first pivots 46, one of the second pivots 47, one of the third pivots 48, and one of the fourth pivots 49 disposed at the same sides are as a group, two groups of components are disposed at opposite sides of the hollow housing 2, that is, two groups of components are symmetrically disposed with respect to the symmetrical surface S. The third connecting rod 43 is disposed along with the symmetrical surface S; therefore, two groups of components disposed at opposite sides share the same third connecting rod 43. The functions, shapes, and connecting methods of the components in the two groups are the same; therefore, only the shared third connecting rod 43, and the first connecting rod 41, the second connecting rod 42, the fourth connecting rod 44, the fifth connecting rod 45, the first pivot 46, the second pivot 47, the third pivot 48, and the fourth pivot 49 in the same group are described below.

Please refer to FIG. 2, the first connecting rod 41 has a fixing hole 411, wherein the shape of the cross-section of the fixing hole 411 is the same as the cross-section of the first shaft 15 along its radial direction; wherein the first connecting rod 41 is set on the first shaft 15 through the fixing hole 411 and is static with respect to the first shaft 15. Therefore, the first connecting rod 41 is static with respect to the base 1. The other end of the first connecting rod 41 and the second connecting rod 42 are pivotally disposed on the first pivot 46.

The second connecting rod 42 is a straight connecting rod, wherein one end of the second connecting rod 42 and the first connecting rod 41 are pivotally disposed on the first pivot 46, and the other end of the second connecting rod 42 and the third connecting rod 43 are pivotally disposed on the second pivot 47.

Figure 6:
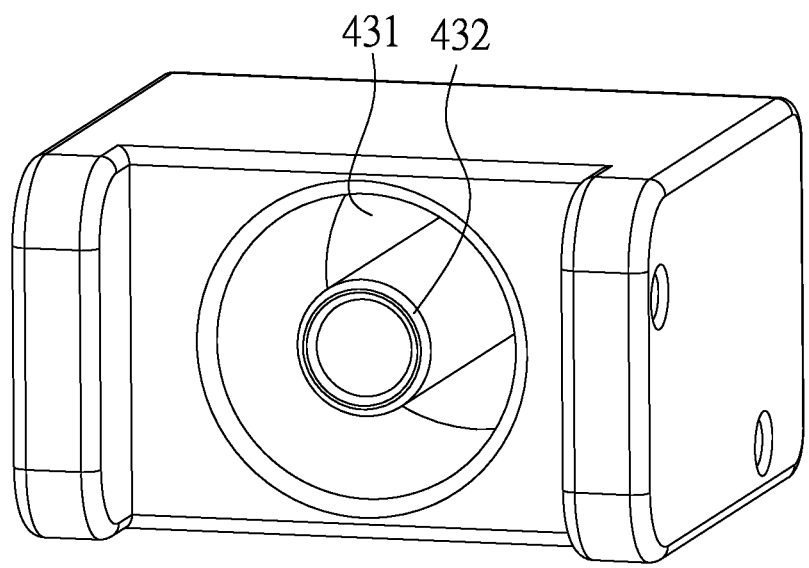
FIG. 6 is a perspective schematic view showing a third connecting rod of the present invention.

The third connecting rod 43 is slidably disposed to the sliding slot 23 and is sleeved on the mandrel 27. Please refer to FIG. 6, the third connecting rod 41 has a concave portion 431 and a hollow cylinder 432. The hollow cylinder 432 is formed in the concave portion 431, the third connecting rod 43 is slidably sleeved on the mandrel 27 through the hollow cylinder 432.

The fourth connecting rod 44 is a curved connecting rod. One end of the fourth connecting rod 44 and the third connecting rod 43 are pivotally disposed on the third pivot 48, and the other end of the fourth connecting rod 44 and the fifth connecting rod 45 are pivotally disposed on the fourth pivot 49.

Figure 7:
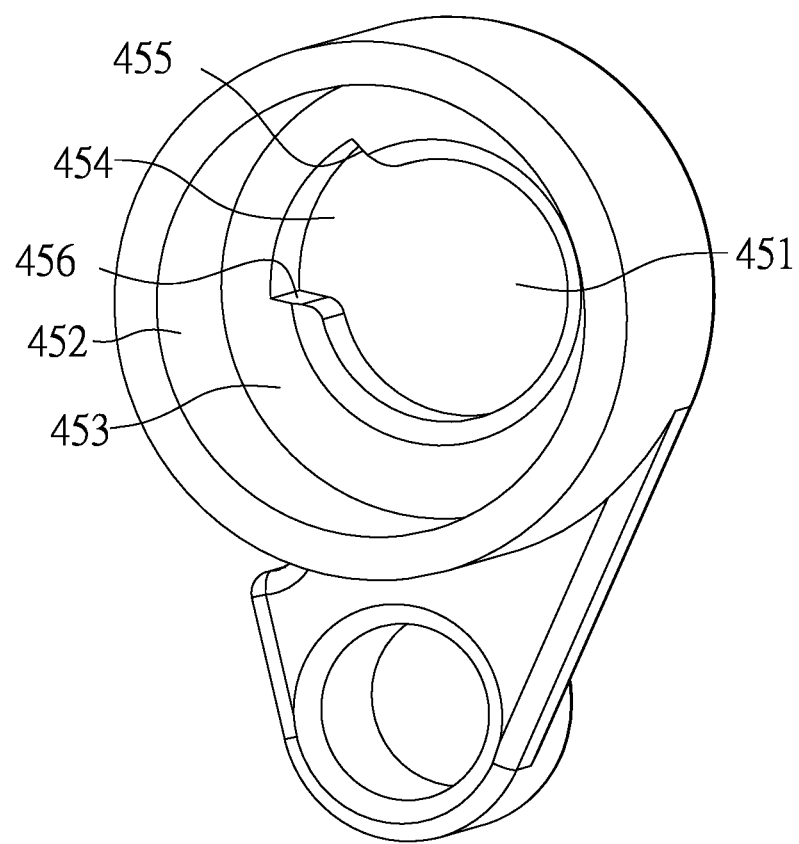
FIG. 7 is a perspective schematic view showing a fifth connecting rod of the present invention.
Figure 8:
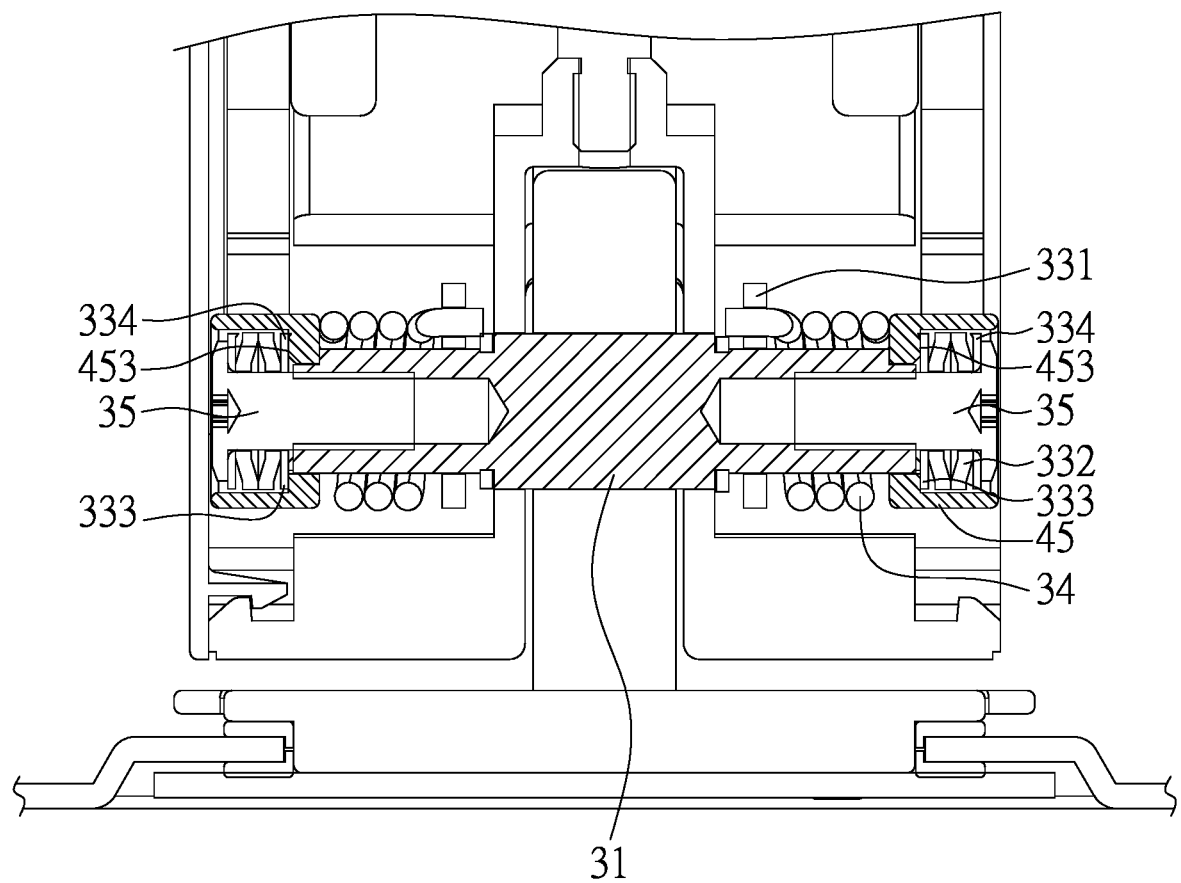
FIG. 8 is a partial section view of a supporting device of the present invention.

Please refer to FIG. 7, the fifth connecting rod 45 has a penetrating hole 451, an accommodating space 452, a pressing part 453, a limiting slot 454, a first limiting surface 455, and a second limiting surface 456. One end of the fifth connecting rod 45 and the fourth connecting rod 44 are pivotally disposed on the fourth pivot 49, the other end of the fifth connecting rod 45 is sleeved on the second shaft 31 through the penetrating hole 451 with a circular cross-section. Please refer to the partial cross-sectional view illustrated in FIG. 8, wherein the bowl washers 332, the first flat washer 333, and the second flat washer 334 sleeved on the second shaft 31 are accommodated in the accommodating space 452, the screw 35 penetrates through the penetrating hole 451 and is screwed to the second shaft 31 for abutting the washer set 33, hence, the first flat washer 333 is abutted against the pressing part 453. The limiting slot 454 is formed between the first limiting surface 455 and the second limiting surface 456 and accommodates the limiting bumps 311 of the second shaft 31. The fifth connecting rod 45 is actuated to rotate together with the fourth connecting rod 44 when the fourth connecting rod 44 rotates with respect to the second shaft 31, while the static friction force generated by the washer set 3 disposed between the second shaft 31 and the pressing part 453 of the fifth connecting rod 45 may actuate the fifth connecting rod 45 and the second shaft 31 to rotate (the fifth connecting rod 45 and the second shaft 31 do not pivotally rotate with respect to each other). When a force is applied to the display 2000 for adjusting the tilt angle (that is, the included angle between the display 2000 and the gravity direction G), the force overcomes the maximum static friction force between the pressing part 453 and the first flat washer 333, the second shaft 31 is not actuated with the fifth connecting rod 45 but rotates with respect to the fifth connecting rod 45 for adjusting the tilt angle of the display 2000. Also, the tilt angle of the bearing module 3 is limited by the first limiting surface 455 and the second limiting surface 456. As the bearing module 3 is in the elevated position shown in FIG. 11, the limiting bump 311 of the second shaft 31 abuts against the first limiting surface 455; as the bearing module 3 is in the depressed position, shown in FIG. 12, the limiting bump 311 of the second shaft 31 abuts against the second limiting surface 456. Accordingly, the bearing module 3 can only move between the elevated position and the depressed position.

Besides, referring FIG. 1 and FIG. 5, a virtual surface P is defined, wherein the virtual surface P extends along the radial direction of the first shaft 15 and the radial direction of the second shaft 31 and passes through the central axis C. The first pivot 46, the second pivot 47, and the fourth pivot 49 are constantly located at the same side of the virtual surface P; while the third pivot 48 is constantly located at the other side of the virtual surface P. In other words, the first pivot 46, the second pivot 47, and the fourth pivot 49 are constantly located on the same side with respect to the central axis C; while the third pivot 47 is constantly located on the other side with respect to the central axis C.

The elastic element 5 is disposed in the sliding slot 23 of the hollow housing 2 and is sleeved on the mandrel 27. One end of the elastic element 5 abuts against the concave portion 431 of the third connecting rod 43 and is sleeved on the hollow cylinder 432; the other end of the elastic element 5 abuts against the second abutting surface 222 of the second pivoting end 22. The elastic element 5 constantly provides an elastic force. The elastic force provided by the elastic element 5 differs along with different levels of compression of the elastic element 5 when the third connecting rod 43 slides along the mandrel 27.

Two covers 6 are respectively disposed at two sides of the hollow housing 2 and cover the components disposed in the hollow housing 2 for avoiding unsightly outer appearance caused by the exposed components.

Figure 9:
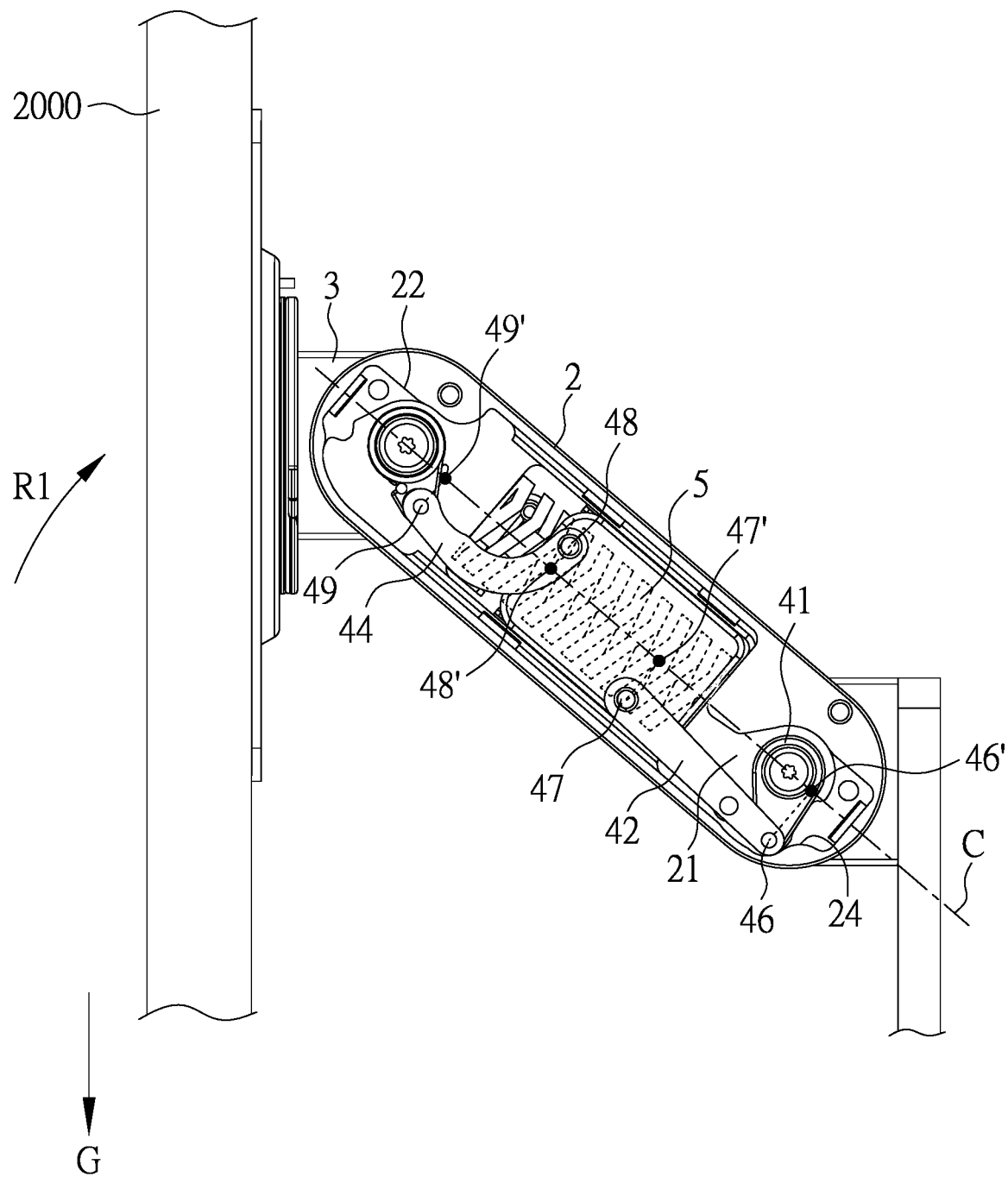
FIG. 9 is a side view showing a supporting device in a raised position of the present invention.
Figure 10:
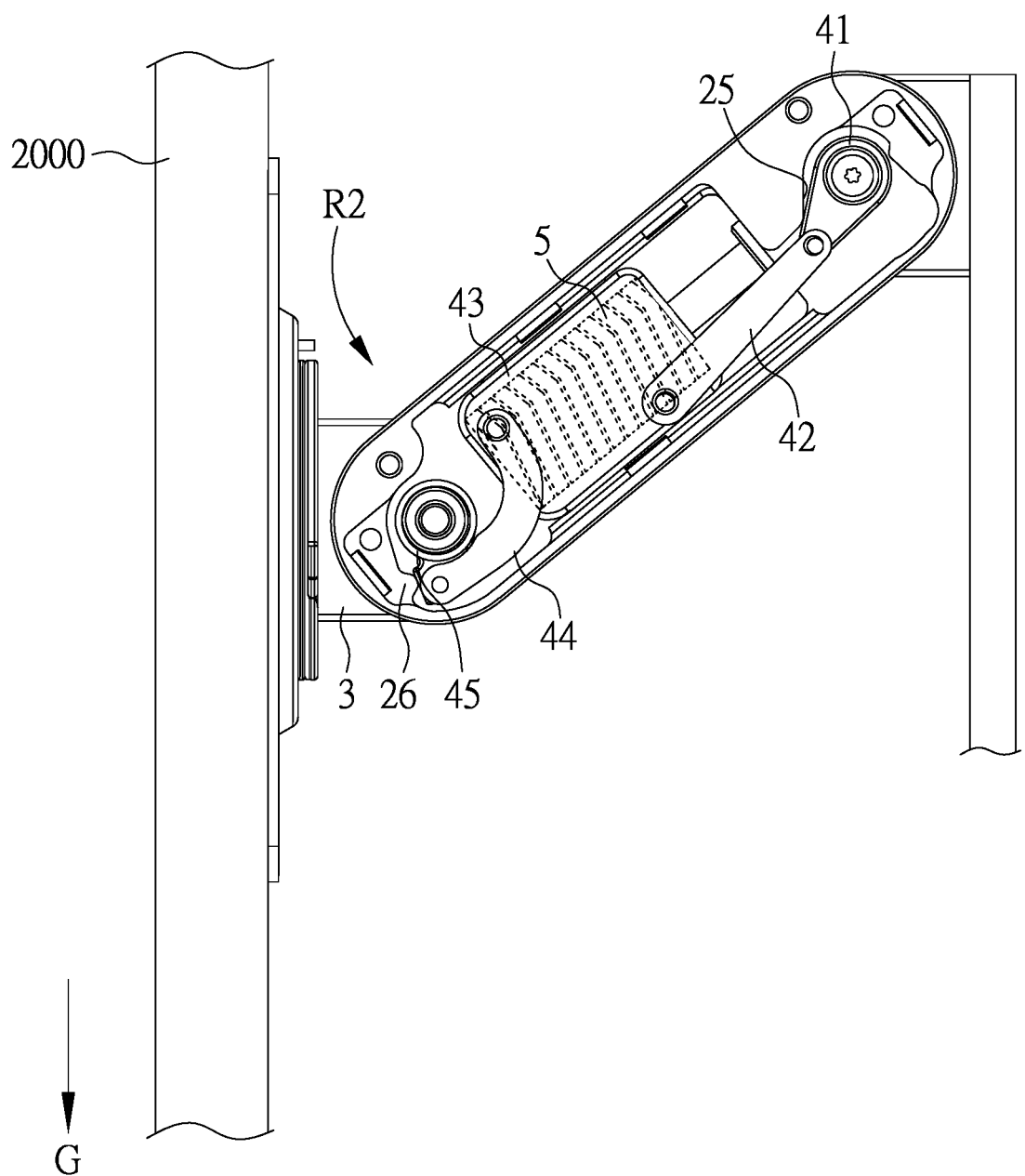
FIG. 10 is a side view showing a supporting device in a down position of the present invention.

In detail, the hollow housing 2 can move between a horizontal position shown in FIG. 5, a raised position shown in FIG. 9, and a down position shown in FIG. 10. The central axis C is perpendicular to the gravity direction G when the hollow housing 2 is in the horizontal position; simultaneously, the elastic force provided by the elastic element 5 is the greatest and may support the weight of the display 2000, hence, the display 2000 may stably stop at the position.

The supporting device 1000 is substantially symmetrical. For a brief description, only those located at one side of the symmetrical surface S among the paired and symmetrically disposed components are described in the descriptions related to the actions of the supporting device 1000 in the following paragraphs.

First, when a force is applied to the bearing module 3 and makes the bearing module 3 move from the horizontal position (FIG. 5) to the raised position (FIG. 9), the second pivoting end 22 of the hollow housing 2 is actuated by the bearing module 3 to rotate in a first rotating direction R1 with the first pivoting end 21 as a rotation center. The second connecting rod 42 is pulled by the static first connecting rod 41 while the hollow housing 2 is moving. The third connecting rod 43 is then pulled by the second connecting rod 42, slides toward the first pivoting end 21 along the sliding slot 23, and then abuts against the first abutting surface 212. The elastic element 5 with one end abutting the third connecting rod 43 is gradually released; therefore, the elastic force provided by the elastic element 5 gradually decreases. Simultaneously, the fourth connecting rod 44 is actuated by the third connecting rod 43 and makes the fourth pivot 49 to rotate along a second rotating direction R2 opposite to the first rotating direction R1. The fifth connecting rod 45 is actuated by the rotation of the fourth connecting rod 44 and rotates along the second rotating direction R2. The second shaft 31 is actuated by the fifth connecting rod 45 simultaneously so that an angle between the bearing module 3 and the gravity direction G remains the same. Accordingly, the display 2000 remains parallel to the gravity direction G during the process of moving the hollow housing 2 from the horizontal position to the raised position. If the tilt angle between the display 2000 and the gravity direction G is initially 30°, the tilt angle will remain 30° during the process of moving the hollow housing 2 from the horizontal position to the raised position.

On the other hand, please refer to FIG. 9, an orthogonal projection 49' of an axis center of the fourth pivot 49 projected on the central axis C locates between the center of the second shaft 31 and an orthogonal projection 48' of an axis center of the third pivot 48 projected on the central axis C, and the center of the first shaft 15 locates between an orthogonal projection 46' of an axis center of the first pivot 46 projected on the central axis C and an orthogonal projection 47' of an axis center of the second pivot 47 projected on the central axis C when the linkage module 4 is in the raised position. Additionally, the first stopper 24 abuts against the first connecting rod 41 so that the first connecting rod 41 is unable to rotate further along the first rotating direction R1; therefore, the rotation angle of the hollow housing 2 is restricted.

When a force is applied to the bearing module 3 for moving the hollow housing 2 from the raised position (FIG. 9) to the horizontal position (FIG. 5), the second pivoting end 22 of the hollow housing 2 is actuated by the bearing module 3 and rotates along the second rotating direction R2 with the first pivoting end 22 as a rotation center. Similarly, the second connecting rod 42 is pushed by the static first connecting rod 41. The third connecting rod 43 is then pushed by the second connecting rod 42 and slides toward the second pivoting end 22. The elastic element 5 is then compressed by the third connecting rod 43 while the elastic force provided by the elastic element 5 is gradually increased. Simultaneously, the fourth connecting rod 44 is actuated by the third connecting rod 43 and makes the fourth pivot 49 rotate along the first rotating direction R1 around the second shaft 31. Also, the fifth connecting rod 45 and the second shaft 31 are actuated to rotate in the first rotating direction R1; therefore, the angle between the bearing module 3 and the gravity direction G remains the same. Accordingly, the angle between the display 2000 and the gravity direction G remains the same during the process of moving the hollow housing 2 from the raised position to the horizontal position. Additionally, please refer to FIG. 5, the center of the second shaft 31 is adjacent to the orthogonal projection 49' of the axis center of the fourth pivot 49 projected on the central axis C.

Similar to the action of moving the bearing module 3 from the raised position to the horizontal position, when a force is applied to the bearing module 3 for moving the hollow housing 2 from the horizontal position (FIG. 5) to the down position (FIG. 10), the second pivoting end 22 of the hollow housing 2 is actuated by the bearing module 3 and rotates along the second rotating direction R2 with the first pivoting end 22 as a rotation center. The second connecting rod 42 is pushed by the static first connecting rod 41. The third connecting rod 43 is then pushed by the second connecting rod 42 and slides toward the second pivoting end 22. The elastic element 5 is then compressed by the third connecting rod 43 until the third connecting rod 43 abuts against the second abutting surface 222. Simultaneously, the fourth connecting rod 44 is actuated by the third connecting rod 43 and makes the fourth pivoting end 49 rotate along the first rotating direction R1 around the second shaft 42. Also, the fifth connecting rod 45 and the second shaft 42 are actuated to rotate along the first rotating direction R1; therefore, the angle between the bearing module 3 and the gravity direction G remains the same. That is, the angle between the display 2000 and the gravity direction G remains the same.

The first stopping unit 26 abuts against the fifth connecting rod 45, the second stopper 25 abuts against the first connecting rod 41; therefore, the rotation angle of the hollow housing 2 towards the second rotating direction R2 is restricted when the hollow housing 2 is at the down position.

Furthermore, similar to the action of moving the bearing module 3 from the horizontal position to the raised position, when a force is applied to the bearing module 3 for moving the bearing module 3 from the down position (FIG. 10) to the horizontal position (FIG. 5), the second pivoting end 22 of the hollow housing 2 is actuated by the bearing module 3 to rotate along the first rotating direction R1 with the first pivoting end 21 as a rotation center. The second connecting rod 42 is pulled by the static first connecting rod 41. The third connecting rod 43 is then pulled by the second connecting rod 42 and slides toward the first pivoting end 21. The elastic element 5 is then released. Simultaneously, the fourth connecting rod 44 is actuated by the third connecting rod 43 and makes the fourth pivoting end 49 rotate along the second rotating direction R2 around the second shaft 42. Also, the fifth connecting rod 45 and the second shaft 42 are actuated to rotate along the second rotating direction R2; therefore, the angle between the display 2000 and the gravity direction G remains the same during the process of moving the hollow housing 2 from the horizontal position to the down position.

Also, a force may be applied to rotate the display 2000 or the connecting plate 36 along the first rotating direction R1 for adjusting the tilt angle of the bearing module 3. When the applied force overcomes the maximum static friction force between the pressing part 453 of the fifth connecting rod 45 and the first flat washer 333, the second shaft 31 rotates toward the first rotating direction R1, the hook washer 331 is actuated by the second shaft 31 and rotates along with the second shaft 31; while the torsional spring 34, which is disposed between the hook washer 331 and the fifth connecting rod 45 and not actuated by the second shaft 31, is released, and the torsional force provided by the torsional spring 34 is changed. The display 2000 may stop at the tilt angle shown in FIG. 11 when the force is removed after the limiting bump 311 of the second shaft 31 abuts against the first limiting surface 455. In the meantime, the bearing module 3 is at the elevated position, wherein an included angle between the bearing module and a horizontal direction is substantially 30 degrees. On the contrary, a force may be applied to rotate the display 2000 or the connecting plate 36 along the second rotating direction R2. When the applied force overcomes the maximum static friction force between the pressing part 453 of the fifth connecting rod 45 and the first flat washer 333, the second shaft 31 rotates toward the second rotating direction R2, while the torsional spring 34 disposed between the hook washer 331 and the fifth connecting rod 45 is twisted, thus the torsional force provided thereby increases. The display 2000 may stop at the tilt angle shown in FIG. 12 when the force is removed after the limiting bump 311 of the second shaft 31 abuts against the second limiting surface 456. In the meantime, the bearing module 3 is in the depressed position, wherein an included angle between the bearing module 3 and the horizontal direction is substantially 5 degrees.

In the embodiments of the present invention, the hollow housing, the bearing module, and the linking module are formed symmetrically or include components that are symmetrically disposed. In other embodiments of the present invention, however, the linking module having components disposed on a single side is operational, that is, the linking module only includes a first connecting rod, a second connecting rod, a fourth connecting rod, a fifth connecting rod, a first pivot, a second pivot, a third pivot, and a fourth pivot. Correspondingly, the hollow housing only includes a first stopper, a second stopper, and a first stopping unit formed on the same side.

The supporting device includes a five-bar linkage, wherein the five-bar linkage is utilized only for the adjustment of the height of the display, that is, the tilt angle of the display remains the same while adjusting the height of the display. Besides, the size of the five-bar linkage is significantly decreased for realizing the demand for a slim appearance.

What is claimed is:

1. A supporting device for bearing a display, comprising:
a base including a first shaft;
a hollow housing including a first pivoting end, a second pivoting end, and a sliding slot, wherein the sliding slot is formed between the first pivoting end and the second pivoting end, the first pivoting end is pivotally connected to the first shaft, and the hollow housing is able to move between a horizontal position and a raised position;
a bearing module being connected to the display and including a second shaft, wherein the hollow housing is connected to the second shaft, a central axis is defined by a center of the first shaft and a center of the second shaft;
a linkage module being accommodated in the hollow housing and including:
a first connecting rod being fixed to the first shaft and being static with respect to the base;
a second connecting rod being pivotally disposed with respect to the first connecting rod through a first pivot;
a third connecting rod being slidably disposed in the sliding slot and pivotally disposed with respect to the second connecting rod through a second pivot;
a fourth connecting rod being pivotally disposed with respect to the third connecting rod through a third pivot; and
a fifth connecting rod being pivotally disposed with respect to the fourth connecting rod through a fourth pivot with one end thereof and disposed to the second shaft with the other end thereof; and
an elastic element being disposed in the hollow housing, abutting the third connecting rod and the second pivoting end, and constantly providing an elastic force;
wherein the elastic force is the greatest when the hollow housing is at the horizontal position, and when the hollow housing is moved from the horizontal position to the raised position, the third connecting rod slides in the sliding slot so that the elastic force decreases to let the hollow housing stop at any position between the horizontal position and the raised position.

2. The supporting device as claimed in claim 1, wherein a virtual surface extending along a radial direction of the first shaft and a radial direction of the second shaft and passing through the central axis is defined, and wherein the first pivot, the second pivot, and the fourth pivot are constantly located at a same side of the virtual surface while the third pivot is constantly located at the other side of the virtual surface.

3. The supporting device as claimed in claim 2, wherein the second pivoting end of the hollow housing is activated by the bearing module to rotate along a first rotating direction about the first pivoting end when the linkage module is moved from the horizontal position to the raised position, hence, the second connecting rod is pulled by the first connecting rod, and the third connecting rod, being pulled by the second connecting rod slides in the sliding slot to make the elastic force of the elastic element decrease, and the fourth connecting rod is activated by the third connecting rod simultaneously while the fourth pivot rotate around the second shaft so that an angle between the bearing module and a gravity direction remains the same.

4. The supporting device as claimed in claim 3, wherein the second connecting rod is a straight connecting rod, and the fourth connecting rod is a curved connecting rod.

5. The supporting device as claimed in claim 4, wherein an orthogonal projection of an axis center of the fourth pivot projected on the central axis locates between the center of the second shaft and an orthogonal projection of an axis center of the third pivot projected on the central axis, and the center of the first shaft locates between an orthogonal projection of an axis center of the first pivot projected on the central axis and an orthogonal projection of an axis center of the second pivot projected on the central axis when the linkage module is in the raised position.

6. The supporting device as claimed in claim 5, wherein the center of the second shaft is adjacent to the orthogonal projection of the axis center of the fourth pivot projected on the central axis when the linkage module is at the horizontal position.

7. The supporting device as claimed in claim 6, wherein the hollow housing further comprises a first stopper, a second stopper, and a first stopping unit, wherein the first stopper and the second stopper are adjacent to the first pivoting end and the first stopping unit is adjacent to the second pivoting end, wherein rotation of the hollow housing along the first rotating direction is restricted by the first stopper when the first stopper abuts against the first connecting rod, and rotation of the hollow housing along a second rotating direction is restricted by the second stopper and the first stopping unit when the second stopper abuts against the first connecting rod and the first stopping unit abuts against the fifth connecting rod, and wherein the second rotating direction is opposite to the first rotating direction.

8. The supporting device as claimed in claim 7, wherein the first pivoting end further includes a first through-hole for setting the first shaft, a shape of a cross-section of the first through-hole is circular, and therefore, the hollow housing does not actuate the first shaft.

9. The supporting device claimed in claim 8, wherein the hollow housing further includes a mandrel, the mandrel is penetrated through the first pivoting end and the second pivoting end, and the third connecting rod further includes a concave portion and a hollow cylinder, and wherein the hollow cylinder is formed in the concave portion, the elastic element is sleeved on the mandrel with one end abutting against the concave portion and being sleeved on the hollow cylinder, and the third connecting rod is slidably sleeved on the mandrel via the hollow cylinder.

10. The supporting device as claimed in claim 9, wherein a cross-section of the first shaft along its radial direction has two arc segments associated to each other and two straight segments between the two arc segments, the base has a via hole, and the first connecting rod has a fixing hole, wherein cross-sections of the via hole and the fixing hole are the same as the cross-section of the first shaft along its radial direction, and wherein the first connecting rod is sleeved on the first shaft through the fixing hole and is static with respect to the first shaft.

11. The supporting device as claimed in claim 1, wherein the bearing module moves between an elevated position and a depressed position and includes a connecting block and at least one washer set, and wherein the washer set is sleeved on the second shaft, and the connecting block is sleeved on the second shaft and is actuated by each other.

12. The supporting device as claimed in claim 11, wherein a cross-section of the second shaft along its radial direction has two arc segments associated to each other and two straight segments between the two arc segments, the connecting block has a mounting hole, wherein the cross-section of the mounting hole is the same as the cross-section of the second shaft along its radial direction, and the fifth connecting rod has a penetrating hole and is sleeved on the second shaft through the penetrating hole, wherein a shape of a cross-section of the penetrating hole is circular; therefore, the second shaft does not actuate the fifth connecting rod.

13. The supporting device as claimed in claim 12, wherein the bearing module further includes at least one torsional spring, the washer set includes a hook washer, two bowl washers, a first flat washer, and a second flat washer, and wherein the hook washer is actuated with the second shaft, one end of the torsional spring is fixed to the hook washer and the other end of the torsional spring is fixed to the fifth connecting rod, and the bowl washers are clamped between the first flat washer and the second flat washer.

14. The supporting device as claimed in claim 13, wherein each of the bowl washers, the first flat washer, and the second flat washer has a first hole with a circular cross-section, the bowl washers, the first flat washer, and the second flat washer are sleeved on the second shaft through the first holes of the bowl washers, the first flat washer, and the second flat washer, and therefore, the second shaft does not actuate the bowl washers, the first flat washer, and the second flat washer, and wherein the hook washer has a second hole and is sleeved on the second shaft through the second hole, with a shape of a cross-section of the second hole being the same as the cross-section of the second shaft along its radial direction so that the hook washer is actuated by the second shaft.

15. The supporting device as claimed in claim 14, wherein the bearing module further has a screw, the fifth connecting rod has an accommodating space and a pressing part, wherein the bowl washers, the first flat washer, the second flat washer and the screw are accommodated in the accommodating space, wherein the bowl washers are clamped between the first flat washer and the second flat washer, the second flat washer contacts with the screw, and the first flat washer contacts with the pressing part, and wherein a tightness between the first flat washer and the pressing part is adjusted by rotating the screw.

16. The supporting device as claimed in claim 15, wherein when the bearing module moves between the elevated position and the depressed position, the fifth connecting rod is not actuated by the second shaft, and one end of the torsional spring rotates with the hook washer while the other end is fixed to the fifth connecting rod and remains static, so that a torsional force provided by the torsional spring is changed and a dynamic friction force is generated from the pressing part of the fifth connecting rod and the first flat washer.

17. The supporting device as claimed in claim 16, wherein the fifth connecting rod has a limiting slot, a first limiting surface, and a second limiting surface, wherein the limiting slot interconnects with the penetrating hole and is formed between the first limiting surface and the second limiting surface, the second shaft has a limiting bump, and the limiting bump is accommodated in the limiting slot, and wherein the limiting bump abuts against the first limiting surface when the bearing module is at the raised position, and abuts against the second limiting surface when the bearing module is at the depressed position.

18. The supporting device as claimed in claim 17, wherein an included angle between the bearing module and a horizontal direction is substantially 30 degrees when the bearing module is at the elevated position, and the included angle between the bearing module and the horizontal direction is substantially 5 degrees when the bearing module when the bearing module is at the depressed position.

* * * * *